(12) United States Patent
Oka et al.

(10) Patent No.: US 7,897,418 B2
(45) Date of Patent: Mar. 1, 2011

(54) METHOD FOR MANUFACTURING SEMICONDUCTOR LIGHT EMITTING DEVICE

(75) Inventors: Takafumi Oka, Tokyo (JP); Masatsugu Kusunoki, Tokyo (JP); Kazushige Kawasaki, Tokyo (JP); Shinji Abe, Tokyo (JP); Hitoshi Sakuma, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 93 days.

(21) Appl. No.: 12/331,515

(22) Filed: Dec. 10, 2008

(65) Prior Publication Data

US 2009/0170225 A1    Jul. 2, 2009

(30) Foreign Application Priority Data

Dec. 28, 2007  (JP) ................................ 2007-338679
Dec. 4, 2008   (JP) ................................ 2008-310062

(51) Int. Cl.
*H01L 21/60* (2006.01)
*H01L 29/15* (2006.01)
*H01L 31/0256* (2006.01)
*H01L 27/15* (2006.01)
*H01L 29/16* (2006.01)
*H01L 31/12* (2006.01)
*H01L 33/00* (2006.01)
*G01R 31/26* (2006.01)

(52) U.S. Cl. ........ 438/22; 257/76; 257/82; 257/E21.001; 257/E33.034; 257/E33.063

(58) Field of Classification Search ................ 438/22, 438/46; 257/76, E21.001, E33.034, E33.063
See application file for complete search history.

(56) References Cited

U.S. PATENT DOCUMENTS

| | | | |
|---|---|---|---|
| 4,824,544 A | | 4/1989 | Mikalesen et al. |
| 7,291,278 B2 | | 11/2007 | Kaneko et al. |
| 7,439,550 B2 | | 10/2008 | Tomioka et al. |
| 2002/0155658 A1 | * | 10/2002 | Al-Shareef et al. ........... 438/239 |
| 2003/0143770 A1 | * | 7/2003 | Takeya ........................ 438/45 |
| 2008/0246049 A1 | | 10/2008 | Saito et al. |

FOREIGN PATENT DOCUMENTS

| | | |
|---|---|---|
| JP | 60-43830 A | 3/1985 |
| JP | 1-116070 A | 5/1989 |
| JP | 5-152248 A | 6/1993 |
| JP | 10-74710 A | 3/1998 |
| JP | 2002-205268 A | 7/2002 |
| JP | 2003-100758 A | 4/2003 |
| JP | 2005-93673 A | 4/2005 |
| JP | 2006-245379 A | 9/2006 |
| JP | 2006-351617 A | 12/2006 |

* cited by examiner

*Primary Examiner* — Andy Huynh
*Assistant Examiner* — Valerie Brown
(74) *Attorney, Agent, or Firm* — Leydig, Voit & Mayer, Ltd.

(57) ABSTRACT

A method for manufacturing a semiconductor light emitting device includes forming an insulating film on a semiconductor substrate, the insulating film having an opening therein, forming a Pd electrode in the opening and on the insulating film, and removing the portion of the Pd electrode on the insulating film by the application of a physical force to the portion, while leaving the Pd electrode in the opening.

20 Claims, 3 Drawing Sheets

METHOD FOR MANUFACTURING SEMICONDUCTOR LIGHT EMITTING DEVICE

BACKGROUND OF THE INVENTION

1. Field of the Invention

The present invention relates to a method for manufacturing a semiconductor light emitting device employing a Pd electrode.

2. Background Art

In semiconductor light emitting devices, the p-type semiconductor layer formed over the active layer is partially connected to the p-type electrode for receiving electrical power and delivering it to the p-type semiconductor layer. That portion of the p-type semiconductor layer connected to the p-type electrode is referred to as the "p-type contact layer." In order to improve the characteristics of the device, e.g., reduce its current consumption, it is necessary that the p-type electrode have good ohmic characteristics and low contact resistance with respect to the underlying p-type contact layer.

For example, the p-type electrode material of some nitride semiconductor light emitting devices used as blue-violet LDs is Pd or contains Pd to meet the above requirement. The Pd electrode is formed at least on the p-type contact layer. However, it is common that the Pd electrode is also formed on an insulating film(s) (which is formed on the p-type semiconductor layer) in order to ensure sufficient process margin. That is, the Pd electrode usually consists of two portions, the contact covering portion and the insulating film covering portion. Further, a pad electrode is formed on the Pd electrode after the formation of the Pd electrode.

Prior art includes Japanese Laid-Open Patent Publication Nos. 60-43830 (1985), 2005-93673, 2003-100758, 2002-205268, 10-74710 (1998), 5-152248 (1993), 1-116070 (1989), 2006-351617, and 2006-245379.

However, since the Pd electrode has poor adhesion to the insulating film, the insulating film covering portion of the Pd electrode may peel off. Some of the material flaked off from the insulating film covering portion may adhere to the surface of the semiconductor light emitting device, thereby reducing the manufacturing yield. Further, in this connection, the insulating film covering portion of the Pd electrode may not completely peel off, but may overhang from the edges of the contact covering portion of the Pd electrode, which prevents the pad electrode from being formed in the desired place at the subsequent pad electrode forming step. This may result in the formation of voids or holes in the pad electrode. Further, the peeling off of the insulating film covering portion of the Pd electrode may result in the peeling off of part of the contact covering portion, exposing a surface of the p-type contact layer. This means that the pad electrode is formed directly on the exposed surface of the p-type contact layer. In such a case, Au, etc. contained in the pad electrode may diffuse into the p-type semiconductor layer, thereby degrading the characteristics and reliability of the semiconductor light emitting device.

In order to prevent the peeling of the insulating film covering portion of the Pd electrode, an adhesive layer may be additionally formed between the insulating film and the Pd electrode to enhance their adhesion to each other. However, forming the adhesive layer in the desired place requires an additional process step, resulting in increased manufacturing cost.

SUMMARY OF THE INVENTION

The present invention has been made to solve the above problems. It is, therefore, an object of the present invention to provide an improved method for manufacturing a semiconductor light emitting device with a Pd electrode, wherein an adhesive layer is not formed between the Pd electrode and the underlying insulating film and wherein the insulating film covering portion of the Pd electrode is deliberately peeled off and removed by a simple process so that no part of that portion is left to adhere to the surface of the device, thus preventing a reduction in the manufacturing yield, and so that the pad electrode subsequently formed on the surface of the device has no voids and is not in direct contact with the p-type contact layer.

According to one aspect of the present invention, a method for manufacturing a semiconductor light emitting device includes the steps of forming an insulating film on a semiconductor, the insulating film having an opening therein, forming a Pd electrode in the opening and on the insulating film, and peeling and removing the portion of the Pd electrode on the insulating film by the application of physical force to the portion while retaining the Pd electrode in the opening.

Other and further objects, features and advantages of the invention will appear more fully from the following description.

DETAILED DESCRIPTION OF THE PREFERRED EMBODIMENT

Embodiment

A first embodiment of the present invention relates to a method for manufacturing a semiconductor light emitting device with a Pd electrode, and more particularly to such a method in which the Pd electrode is formed and processed by a simple process in such a manner as to avoid problems, such as a reduction in the manufacturing yield. There will now be described, with reference to FIG. 1 and subsequent figures, a method for manufacturing a semiconductor light emitting device according to the first embodiment. It should be noted that for convenience of explanation the term "semiconductor light emitting device," as used in the following description, refers to both completed and uncompleted semiconductor light emitting devices, i.e., including substrates from which a semiconductor light emitting device is being formed.

Figure 1:
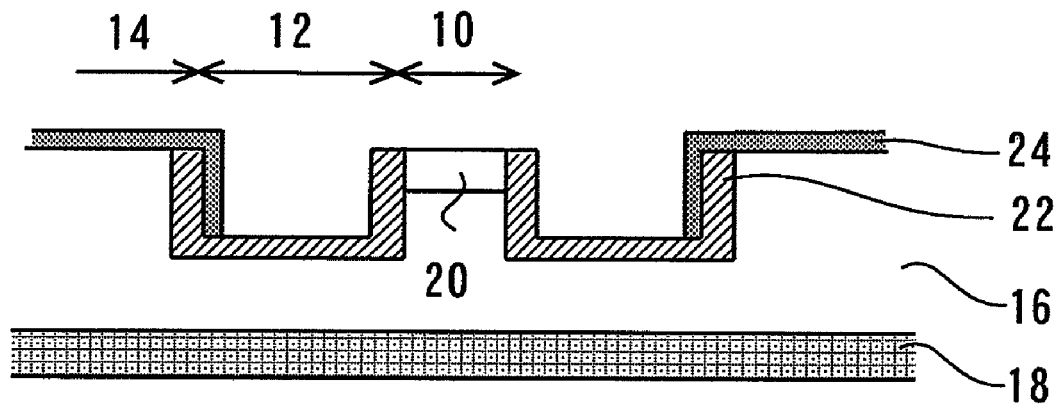
FIG. 1 is a diagram illustrating a step of forming insulating films according to the embodiment.

FIG. 1 is a diagram illustrating a step of forming insulating films according to the present embodiment. The semiconductor light emitting device of the present embodiment is formed from a GaN substrate and includes an active layer 18 (which is omitted from FIG. 2 and subsequent figures). A p-type semiconductor layer 16 is formed over the active layer 18 and includes channel portions (or recesses) 12 at predetermined locations. Each channel portion 12 is a groove defined between the ridge portion 10 and a respective terrace portion 14. A p-type contact layer 20 is formed at the top of the ridge portion 10 and connected to an electrode (described later) for receiving electrical power and delivering it to the p-type semiconductor layer 16. According to the present embodiment, the height difference between the top surface of the ridge portion 10 and the bottom surfaces of the channel portions 12 is 0.5 μm, and the width of the ridge portion 10 is 1.5 μm.

A first insulating film 22 is then formed on the surface of the wafer, specifically, on the channel portions 12. Further, a second insulating film 24 is formed on the terrace portions 14 and on portions of the channel portions 12 (see FIG. 1). That is, the first and second insulating films 22 and 24 together form an opening which exposes the p-type contact layer 20 at the top of the ridge portion 10. According to the present embodiment, both the first and second insulating films 22 and 24 are made of $SiO_2$.

Figure 2:
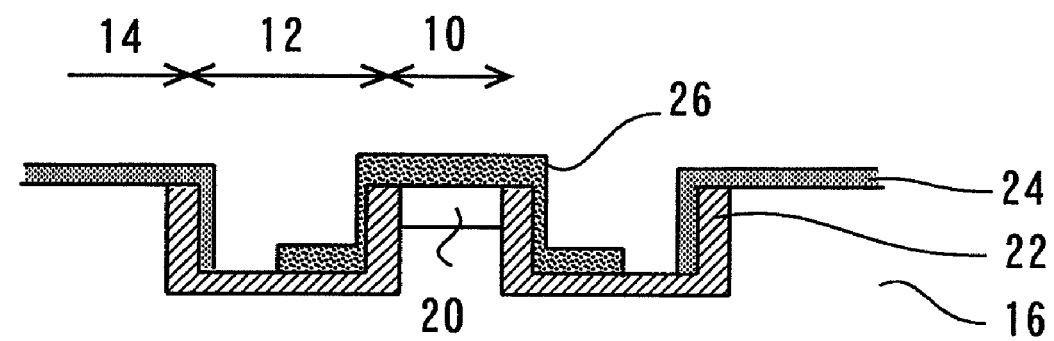
FIG. 2 is a diagram illustrating a step of Pd electrode formation.

FIG. 2 is a diagram illustrating a step subsequent to that shown in FIG. 1, wherein a Pd electrode 26 is formed. According to the present embodiment, the Pd electrode 26 is formed over the ridge portion 10 by normal incidence deposition (i.e., a deposition substantially perpendicular to the principal surface of the wafer or semiconductor light emitting device). More specifically, the Pd electrode 26 covers the top and side surfaces of the ridge portion 10 and continuously extends to cover portions of the bottom surfaces of the channel portions 12. It should be noted that the surface portions of the device which are not to be covered by the Pd electrode may be covered by a resist, etc. before the formation of the Pd electrode with normal incidence deposition. As a result of the effect of the normal incidence deposition, the Pd electrode is thicker at the top surface of the ridge portion 10 and at the bottoms of the channel portions 12 and thinner at the sides of the ridge portion 10.

According to the present embodiment, the Pd electrode 26 is 100 nm thick at the top surface of the ridge portion 10. As shown in FIG. 2, the Pd electrode 26 is divided into two portions: that portion in contact with the first insulating film 22 (hereinafter referred to as the "insulating film covering portion"); and that portion in contact with the p-type contact layer (hereinafter referred to as the "contact covering portion"). According to the present embodiment, the insulating film covering portion of the Pd electrode overlays the bottom of each channel portion 12 by a length of 2.75 μm.

After the formation of the Pd electrode 26, the wafer is subjected to a sintering heat treatment to enhance the adhesion between the p-type contact layer 20 and the contact covering portion of the Pd electrode 26. This sintering heat treatment is typically performed at, but is not limited to, a temperature of approximately 400-550° C.

Figure 3:
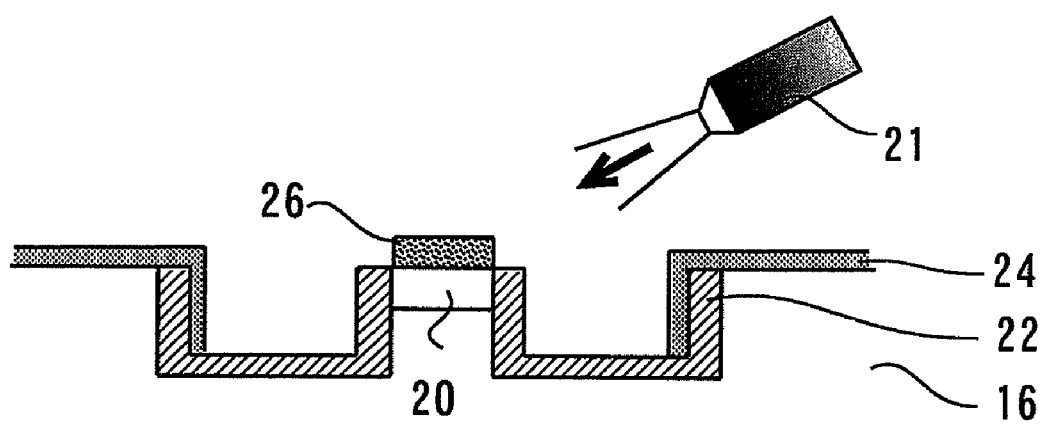
FIG. 3 is a diagram illustrating a peeling step of the insulating film covering portion of the Pd electrode.

FIG. 3 is a diagram illustrating a step (a peeling step) subsequent to the step shown in FIG. 2, wherein the insulating film covering portion of the Pd electrode 26 is peeled off. The Pd electrode has poor adhesion to the second insulating film 22 and tends to peel off therefrom although it has good adhesion to the p-type contact layer 20 (which is a part of the p-type semiconductor layer 16). That is, the insulating film covering portion of the Pd electrode can be peeled off by the application of physical force.

According to the method of the present embodiment for manufacturing a semiconductor light emitting device, the insulating film covering portion of the Pd electrode is peeled off using the force of the liquid sprayed or squirted from a liquid spray jet device 21, as shown in FIG. 3. The liquid spray jet device 21 is adapted to scan the principal surface of the wafer (or move parallel to this surface), spraying a liquid against it. The liquid jet nozzle of the liquid spray jet device 21 is set to be at a predetermined angle with the normal to the principal surface of the wafer. According to the present embodiment, the liquid spray jet device 21 includes a two-liquid particle vaporizer that discharges a liquid mixture of $N_2$ and purified water.

When the insulating film covering portion of the Pd electrode 26 is peeled off by use of the liquid spray jet device 21 in the manner described above, the contact covering portion of the Pd electrode 26 is prevented from being peeled along with it. This is accomplished by setting the flow rate and pressure of the liquid sprayed from the liquid spray jet device 21 such that the resulting force applied to the Pd electrode 26 is great enough to peel off the insulating film covering portion but not great enough to peel the contact covering portion. According to the present embodiment, the flow rate and the pressure of the liquid sprayed from the liquid spray jet device 21 are 200 ml/min and 0.4 MPa.

Figure 4:
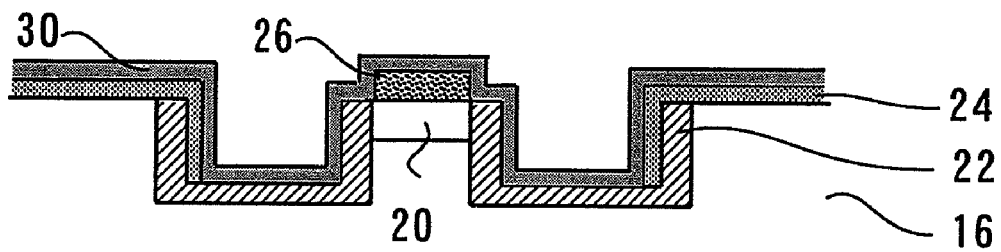
FIG. 4 is a diagram illustrating a step of adhesive layer formation.

FIG. 4 is a diagram illustrating a step subsequent to that shown in FIG. 3, wherein an adhesive layer 30 is formed over the ridge portion 10, the channel portions 12, and the terrace portions 14. According to the present embodiment, the adhesive layer 30 is Ti or Cr and serves to enhance the adhesion between the wafer and the barrier metal layer (32) to be formed thereon (described later).

Figure 5:
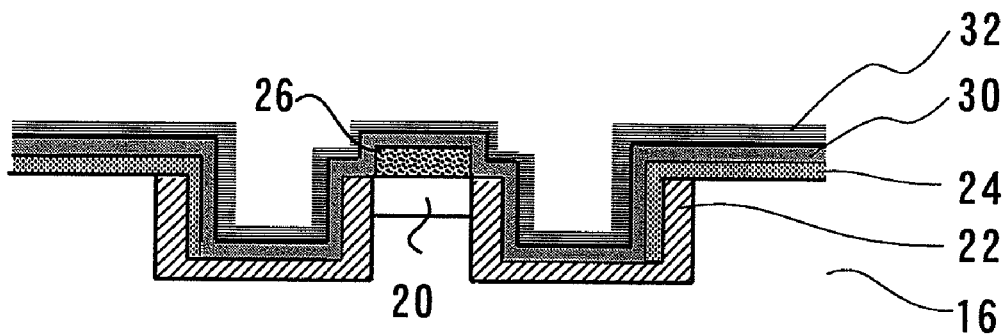
FIG. 5 is a diagram illustrating a step of the barrier metal layer formation.

FIG. 5 is a diagram illustrating a step subsequent to that shown in FIG. 4, wherein the barrier metal layer 32 is formed over the adhesive layer 30. According to the present embodiment, the barrier metal layer 32 is Pt and serves to block diffusion of metal atoms into the p-type semiconductor layer. It should be noted that the barrier metal layer may be made of any suitable conductive material that prevents diffusion of substance into the adjacent layers. Therefore, the barrier metal layer may be Mo, Ta, or Ni, instead of Pt.

Figure 6:
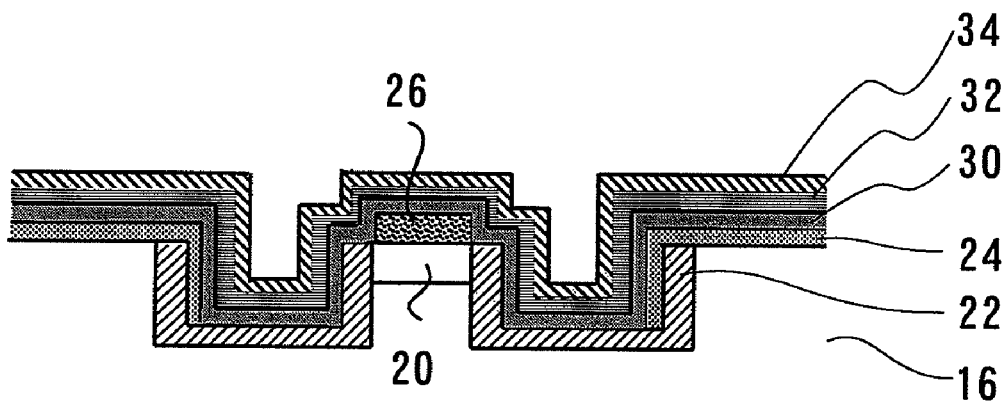
FIG. 6 is a diagram illustrating a step of the pad electrode formation.

FIG. 6 is a diagram illustrating a step subsequent to that shown in FIG. 5, wherein a pad electrode 34 is formed over the barrier metal layer 32. According to the present embodiment, the pad electrode 34 may have a multilayer structure or a single-layer structure, and includes at least an Au-containing layer. This completes the description of the first embodiment of the present invention. The following description will be directed to the problems which have led to the present invention.

Generally, in order to improve the electrical characteristics of a nitride semiconductor light emitting device (e.g., of GaN, etc.), it is necessary that the p-type electrode have low resistance and good ohmic characteristics (with respect to the underlying contact layer). Pd electrodes are likely to satisfy this requirement. However, they inherently have poor adhesion to insulating films. Therefore, it happens that a Pd electrode formed over a p-type semiconductor layer (or contact layer) and an insulating film peels off from the insulating film. It will be noted that it is only necessary that the Pd electrode be in contact with the p-type semiconductor layer (or contact layer); there is no need to form the Pd electrode on the insulating film. However, it is not practical to form the pd electrode only on and in contact with the p-type semiconductor layer (or contact layer), since such an arrangement requires high alignment accuracy and repeatability resulting in reduced process margin. Therefore, it is necessary to form the Pd electrode in contact with both the p-type semiconductor layer and the insulating film. This means that the insulating film covering portion of the Pd electrode may peel off, thereby causing the problems mentioned above.

Figure 7:
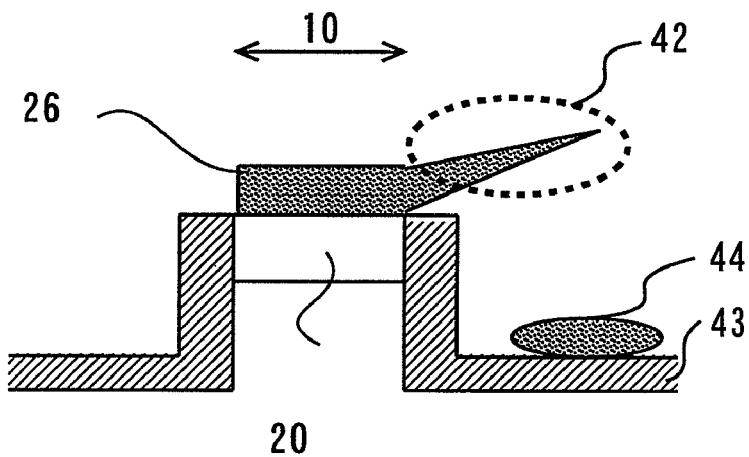
FIG. 7 illustrates typical problems resulting from the peeling of the Pd electrode.

FIG. 7 illustrates typical problems resulting from the peeling of the Pd electrode described above. Material 44 flaked off from the insulating film covering portion of the Pd electrode may attach, e.g., to a channel portion, which may lead to degradation of the film quality of the pad electrode formed at the subsequent pad electrode forming step. Further, a portion 42 of the peeled insulating film covering portion of the Pd electrode may remain connected to the contact covering portion of the Pd electrode and may overhang from the edge of the contact covering portion, forming a burr, as shown in FIG. 7. This overhanging burr portion 42 may prevent the formation of the directly underlying portion of the pad electrode at the subsequent pad electrode forming step. As a result, the formed pad electrode may have an irregular shape or may include unwanted voids.

Figure 8:
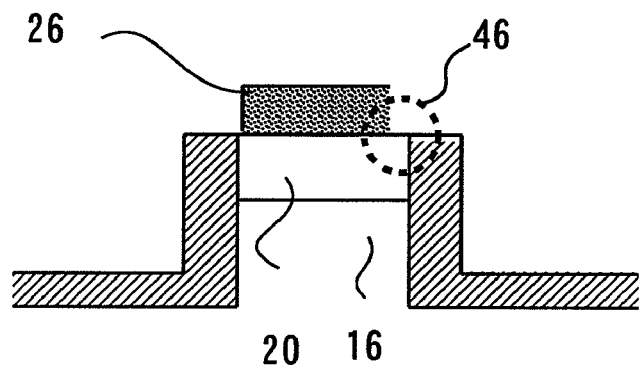
FIG. 8 illustrates another typical problem resulting from the peeling of the Pd electrode.

FIG. 8 illustrates another typical problem resulting from the peeling of the Pd electrode described above. Specifically, FIG. 8 shows a ridge portion and the overlying Pd electrode which has its insulating film covering portion peeled away and has an edge portion of its contact covering portion torn away as a result of the peeling away of the insulating film covering portion. It should be noted that although the contact covering portion of the Pd electrode has good adhesion to the p-type contact layer 20, it happens that a portion of the contact covering portion contiguous to the insulating film covering portion is peeled off together with the insulating film covering portion, thereby exposing an edge portion 46 of the p-type contact layer 20, as shown in FIG. 8. In such a case, the pad electrode is formed directly on the exposed portion 46 of the contact layer 20 at the subsequent pad electrode forming step. At that time, Au, etc. contained in the pad electrode diffuse into the p-type semiconductor layer 16 through the exposed portion 46 of the contact layer 20. This results in the formation of a deep state in the bandgap of the active layer, which may alter or degrade the electrical and optical characteristics of the semiconductor light emitting device.

Thus, in the past the formation of a p-type electrode of Pd has been accompanied by the typical problems described above with reference to FIGS. 7 and 8 and has resulted in a reduction in the manufacturing yield.

The problems illustrated in FIGS. 7 and 8 result from the peeling of the Pd electrode. Therefore, an adhesive layer may be additionally formed between the Pd electrode and the underlying insulating film to enhance their adhesion to each other. This will prevent the peeling of the Pd electrode, thereby avoiding the problems illustrated in FIGS. 7 and 8 and increasing the manufacturing yield. However, forming such an adhesive layer will require an additional process step (complicating the manufacturing process), resulting in increased manufacturing cost.

The method of the present embodiment for manufacturing a semiconductor light emitting device avoids the problems illustrated in FIGS. 7 and 8 by employing a simple process, i.e., without complicating the manufacturing process. According to this method, the insulating film covering portion of the Pd electrode is peeled off and carried away from the surface of the semiconductor light emitting device by the liquid sprayed or squirted from the liquid spray jet device 21, thus eliminating the possibility that material flaked off from the insulating film covering portion (see FIG. 7) will attach to the surface of the semiconductor light emitting device.

Figure 9:
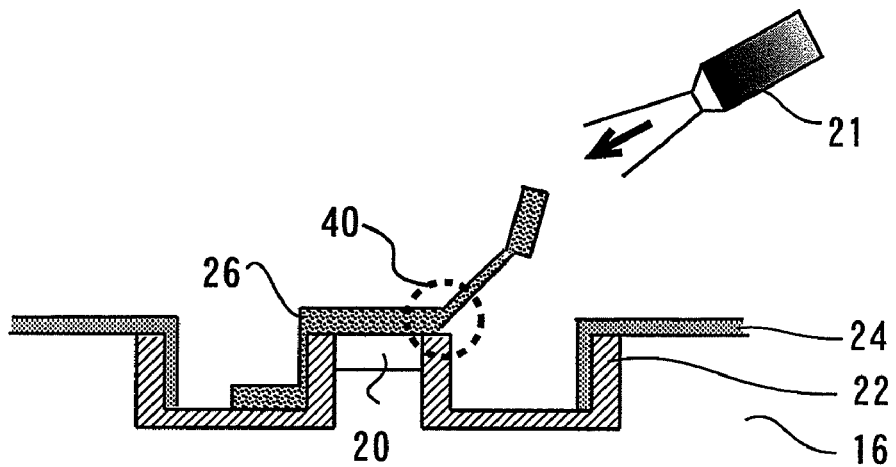
FIG. 9 illustrates a typical example of how the insulating film covering portion of the Pd electrode is peeled off by the liquid sprayed from the liquid spray jet device.

Further, the method of the present embodiment also avoids the formation of the burr portion 42 shown in FIG. 7, as described below with reference to FIG. 9. FIG. 9 illustrates a typical example of how the insulating film covering portion of the Pd electrode is peeled off by the liquid sprayed from the liquid spray jet device 21. Since the insulating film covering portion has poor adhesion to the underlying insulating film, this portion peels automatically or is peeled by the liquid sprayed from the liquid spray jet device 21 during the process. The peeled insulating film covering portion of the Pd electrode is then torn away from the contact covering portion by the force of the liquid sprayed from the liquid spray jet device 21. Reference numeral 40 denotes a boundary, or cutoff zone, 40 between the contact covering portion and the insulating film covering portion of the Pd electrode, and the Pd electrode is cut along this zone 40 by the sprayed liquid.

In order to facilitate the cutting of the Pd electrode along the cutoff zone 40, the present embodiment includes the following three structural features. A first feature is that the Pd electrode is thinner at the side surfaces of the ridge portion than at the other surfaces of the ridge portion since the electrode is formed by normal incidence deposition. This makes it easier to cut the Pd electrode along the cutoff zone 40. Second, the contact covering portion of the Pd electrode 26 has a thickness of 100 nm, which is small enough to further facilitate the cutting of the Pd electrode along the cutoff zone 40.

A third feature is that the insulating film covering portion of the Pd electrode 26 extends 2.75 µm in length over the bottom of each channel portion 12. This extending portion of the insulating film covering portion, located on the bottom of the channel portion 12, is hereinafter referred to as the "channel bottom covering portion." The channel bottom covering portion of the insulating film covering portion of the Pd electrode 26 receives the force of liquid sprayed from the liquid spray jet device 21, as shown in FIG. 9. Therefore, the longer (or wider) the channel bottom covering portion, the more liquid force is applied to it and hence the more likely that the Pd electrode 26 is cut along the cutoff zone 40. According to the present embodiment, the channel bottom covering portion of the Pd electrode has a length of 2.75 µm, which is long enough to further facilitate the cutting of the Pd electrode along the cutoff zone 40.

Referring now to FIG. 7, if an outside tearing force is not applied to the burr portion 42 (e.g., by sprayed liquid), then it is likely that this portion will not be cut off and will remain connected to the contact covering portion of the Pd electrode. According to the present embodiment, the burr portion 42 (and any similar burrs) is removed by the force of the liquid sprayed from the liquid spray jet device 21. Furthermore, the above-described three structural features of the present embodiment also facilitate the removal of the burr portion (i.e., a remaining portion of the insulating film covering portion of the Pd electrode). Therefore, according to the method of the present embodiment for manufacturing a semiconductor light emitting device, the Pd electrode has no burrs at the time when the pad electrode is formed thereon.

According to the present invention, since the insulating film covering portion of the Pd electrode is removed by the application of external force, an edge portion 46 of the contact layer may be exposed as a result of this removal operation, as shown in FIG. 8. To overcome this problem, the method of the present embodiment for manufacturing a semiconductor light emitting device includes a step of forming a barrier metal layer 32 after the peeling step and before the formation of the pad electrode 34. That is, the barrier metal layer 32 prevents diffusion of conductive materials (i.e., metals such as Au) contained in the pad electrode into the p-type semiconductor layer through the exposed portion 46 of the contact layer, thereby avoiding degradation in the characteristics of the semiconductor light emitting device.

It should be noted that it is a simple process to remove the insulating film covering portion of the Pd electrode by use of the liquid spray jet device 21 after the formation of the electrode; this process increases the takt time only slightly. That is, the method of the present embodiment eliminates the possibility of the occurrence of the remaining electrode material 44 and the burr portion 42 shown in FIG. 7 in a simple manner, i.e., by removing the insulating film covering portion using the liquid spray jet device 21, which is simpler than forming an adhesive layer between the Pd electrode and the underlying insulating film.

Thus, a first feature or aspect of the present invention is to remove the insulating film covering portion of the Pd electrode by the application of external force thereto in order to eliminate the possibility of the occurrence of burrs on the Pd electrode and the possibility of flaked electrode material being left on the surface of the device. A second feature or aspect of the present invention is to form a barrier metal layer before the formation of the pad electrode in order to prevent diffusion of conductive material into the p-type semiconductor layer through an exposed portion (if any) of the contact layer.

Although in the present embodiment a liquid mixture of $N_2$ and purified water is sprayed from the liquid spray jet device 21, it is to be understood that in other embodiments other suitable liquids may be used. That is, an object of the present invention is to peel off the insulating film covering portion of the Pd electrode by the application of external force. Therefore, for example, purified water alone may be used instead of a liquid mixture of $N_2$ and purified water, or an organic solvent such as acetone may be used to ensure that the surface of the semiconductor light emitting device quickly dries after the peeling off of the insulating film covering portion. Further, the jet nozzle of the liquid spray jet device 21 may be ultrasonically vibrated to more efficiently peel off the insulating film covering portion of the Pd electrode. It is to be noted, however, that the liquid sprayed from the liquid spray jet device 21 should not be of the type that dissolves or transforms the Pd electrode and the insulating films (i.e., in the present embodiment, the first and second insulating films) when it is brought into contact with them.

Further, the liquid spray jet device 21 is only one example of means for applying physical force to the insulating film covering portion of the Pd electrode, and the present embodiment is not limited to this particular device. Therefore, for example, the wafer may be immersed in a chemical solution bath or purified water bath, and ultrasonic vibration may be applied to the wafer to apply physical force to the insulating film covering portion of the Pd electrode, resulting in the same advantages as described above in connection with the present embodiment. Further, an inert gas such as $N_2$ gas may be blown against the insulating film covering portion of the Pd electrode (air blow), with the same effect. Likewise, various methods can be used to produce the same effect, including the following: particles may be blown against the insulating film covering portion of the Pd electrode; the wafer may be rotated to apply centrifugal force to the insulating film covering portion; the insulating film covering portion may be sucked by a suction device; adhesive tape may be applied to the insulating film covering portion and then peeled away.

Although in the present embodiment the first and second insulating films 22 and 24 are $SiO_2$, it is to be understood that in other embodiments they may be made of other materials, e.g., selected from the group consisting of SiN, SiON, TEOS, $ZrO_2$, $TiO_2$, $Ta_2O_5$, $Al_2O_3$, $Nb_2O_5$, $Hf_2O_5$, and AlN, with the same effect.

Although in the present embodiment the Pd electrode is formed by normal incidence deposition, it is to be understood that in other embodiments other techniques may be used instead. Specifically, the Pd electrode formed by normal incidence deposition is thinner at the side surfaces of the ridge portion than at the other surfaces of the ridge portion, which facilitates the peeling off of the insulating film covering portion of the Pd electrode. However, if it is not necessary to ensure as much facilitation of the peeling as is provided by normal incidence deposition, sputtering or CVD may be used to form the Pd electrode, resulting in the same advantages as described above in connection with the present embodiment. In the case of the manufacture of a semiconductor light emitting device of GaN-based material, such as the semiconductor light emitting device of the present embodiment, film formation by deposition (e.g., normal incidence deposition) does not cause any dry damage to the substrate. On the other hand, when sputtering is used to form the Pd electrode, the dry damage due to the plasma used must be limited to within an acceptable level.

Although in the present embodiment the contact covering portion of the Pd electrode has a thickness of 100 nm, it is to be understood that in other embodiments it may have a different thickness. Specifically, the contact covering portion of the Pd electrode may have a thickness greater than 10 nm (corresponding to the island stage of the growth process) and less than 400 nm to ensure that the Pd electrode can be easily cut along the cutoff zone 40.

Although in the present embodiment the channel bottom covering portion of the Pd electrode has a length of 2.75 μm, it is to be understood that in other embodiments it may have a different length. More specifically, the longer the channel bottom covering portion of the Pd electrode, the more easily the Pd electrode can be cut along the cutoff zone 40, as described above. The channel bottom covering portion must be at least 0.5 μm long to ensure sufficient process margin. Further, it has been found that the Pd electrode can be cut along the cutoff zone 40 by use of the liquid spray jet device 21 of the present embodiment with high repeatability if the channel bottom covering portion of the Pd electrode has a length of 2.75 μm or more. Therefore, the length of the channel bottom covering portion is preferably 2.75 μm or more.

Although in the present embodiment the adhesive layer 30 is formed before barrier metal forming step to enhance the adhesion between the wafer and the barrier metal layer 32, present invention is not limited to this. Therefore, adhesive layer 30 may be formed after barrier metal forming step and before pad electrode forming step. Likewise, adhesive layer 30 may be formed above and below the barrier metal layer 32. On the other hand, it is to be understood that this adhesive layer 30 is not necessarily required and other embodiments may not include it if the adhesion of layer is sufficient without adhesive layer 30. It should be noted that the present invention requires that the Pd electrode be in contact with the underlying insulating films (i.e., the first and second insulating film) to achieve the advantages described above in connection with the present embodiment. Therefore, in accordance with the present invention, an adhesive layer is not formed between the Pd electrode and the underlying insulating films.

Although in the present embodiment the substrate of the semiconductor light emitting device is made of GaN-based material, it is to be understood that in other embodiments the substrate may be made of any other suitable material that allows it to be in low resistance ohmic contact with Pd electrodes (or Pd-containing electrodes).

Although in the present embodiment the wafer is subjected to a sintering heat treatment after the formation of the Pd electrode 26, it is to be understood that this sintering heat treatment may be performed at any suitable point in the manufacturing process if it enhances the adhesion between the contact covering portion of the Pd electrode and the p-type contact layer. Likewise, the sintering heat treatment may be effected at any suitable temperature.

The problems resulting from the peeling off of the insulating film covering portion of the Pd electrode, described above with reference to FIG. 7, can arise at any time after the formation of the Pd electrode, since the Pd electrode has poor adhesion to the underlying insulating films. It has been found, however, that such problems are particularly prominent after the sintering heat treatment. The reason for this is thought to be that sintering heat treatment reduces the adhesion between the Pd electrode and the underlying insulating films since the Pd electrode (Pd) and these insulating films ($SiO_2$) have significantly different coefficients of thermal expansion. Therefore, the peeling step of peeling off the insulating film covering portion of the Pd electrode may be performed after the sintering heat treatment in order to facilitate the peeling operation and to remove those portions of the Pd electrode which have been peeled due to the sintering heat treatment. However, the peeling step can be performed before the sintering heat treatment if the insulating film covering portion of the Pd electrode can be sufficiently removed by the step, that is, if, for example, the remaining material 44 and the burr portion 42 shown in FIG. 7 can be removed (an advantage of the present invention).

The Pd electrode of the present embodiment is not limited to a single-layer structure of Pd. The Pd electrode may have a laminated or layered structure of Pd/Ta, or Pd/Ta/Pd (the symbol "/" indicating a stacked relationship). Further, the pad electrode of the present embodiment may have a laminated structure of Ti/Ta/Ti/Au, or Ti/Mo/Ti/Au, resulting in the same advantages as described above in connection with the present embodiment.

As described above, one aspect of the present invention is to remove (or peeling away) the insulating film covering portion of the Pd electrode from the wafer surface by the application of external force thereto. Another aspect of the present invention is to form a barrier metal layer in order to prevent diffusion of metals contained in the pad electrode into the p-type semiconductor layer. Therefore, various alterations may be made to the described embodiments without departing from the scope of the present invention.

Thus the present invention provides an improved method for manufacturing a semiconductor light emitting device with a Pd electrode, wherein the insulating film covering portion of the Pd electrode is deliberately peeled off and removed by a simple process in order to avoid problems associated with the peeling of that portion.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-338679, filed on Dec. 28, 2007 including specification, claims, drawings and summary, on which the Convention priority of the present application is based, are incorporated herein by reference in its entirety.

What is claimed is:

1. A method for manufacturing a semiconductor light emitting device, comprising, sequentially:
   forming a semiconductor structure by depositing a semiconductor layer on a semiconductor substrate;
   forming an insulating film on said semiconductor layer, said insulating film having an opening exposing only a part of said semiconductor layer;
   forming a Pd electrode having a first portion in the opening and in contact with said semiconductor layer, and a second portion on said insulating film; and
   removing the second portion of said Pd electrode from said insulating film by application of a physical force to the second portion of said Pd electrode, leaving the first portion of said Pd electrode in the opening and in contact with said semiconductor layer.

2. The method as claimed in claim 1, wherein the physical force applied is selected from the group consisting of spraying a liquid against said Pd electrode, ultrasonically vibrating said Pd electrode, blowing air against said Pd electrode, spraying particles against said Pd electrode, applying a centrifugal force to said Pd electrode, applying suction to said Pd electrode, and applying and removing an adherent tape to said Pd electrode.

3. The method as claimed in claim 1, further comprising heat treating after forming said Pd electrode and before removing the second portion of said Pd electrode.

4. The method as claimed in claim 1, wherein said Pd electrode is a laminated structure including a plurality of layers and a top layer of palladium.

5. The method as claimed in claim 1, further comprising:
   forming a barrier metal layer on said Pd electrode, after removing the second portion of said Pd electrode; and
   forming an Au-containing pad electrode on said barrier metal layer.

6. The method as claimed in claim 5, wherein said barrier metal layer contains an element selected from the group consisting of Pt, Mo, Ta, and Ni.

7. The method as claimed in claim 5, further comprising forming an adhesive layer selected from the group consisting of Ti and Cr on said Pd electrode, after removing the second portion of said Pd electrode and before forming said barrier metal layer.

8. The method as claimed in claim 5, further comprising forming an adhesive layer selected from the group consisting of Ti and Cr on said Pd electrode, after forming said barrier metal layer and before forming said pad electrode.

9. A method for manufacturing a semiconductor light emitting device, comprising:
   forming a semiconductor structure by depositing a semiconductor layer on a semiconductor substrate;
   forming a ridge in said semiconductor structure by removing parts of said semiconductor substrate and said semiconductor layer to form channels sandwiching said ridge;
   forming an insulating film in the channels, covering bottom and side surfaces of the channels and side surfaces of said semiconductor layer at said ridge, leaving said semiconductor layer exposed at a top surface of said ridge;
   forming a Pd electrode having a first portion on and contacting said semiconductor layer on the top surface of said ridge, and a second portion on said insulating film in the channels; and
   removing the second portion of said Pd electrode from said insulating film in the channels by application of a physical force to the second portion of said Pd electrode, leaving the first portion of said Pd electrode on and in contact with said semiconductor layer at the top surface of said ridge.

10. The method as claimed in claim 9, including, in forming said Pd electrode, covering said ridge with said Pd electrode, said Pd electrode extending from the side surfaces of said ridge by at least 0.5 µm along the bottom surfaces of the channels, adjacent said ridge.

11. The method as claimed in claim 9, including, in forming said Pd electrode, covering said ridge with said Pd electrode, said Pd electrode extending from the side surfaces of said ridge by at least 2.75 µm along the bottom surfaces of the channels, adjacent said ridge.

12. The method as claimed in claim 9, including forming the first portion of said Pd electrode on the top surface of said ridge to a thickness in a range from 10 to 400 nm.

13. The method as claimed in claim 9, including forming said Pd electrode by depositing palladium in a direction substantially perpendicular to said semiconductor substrate so that said Pd electrode is thicker on the top surface of said ridge and in the channels than on the side surfaces of the ridge.

14. The method as claimed in claim 9, wherein the physical force applied is selected from the group consisting of spraying a liquid against said Pd electrode, ultrasonically vibrating said Pd electrode, blowing air against said Pd electrode, spraying particles against said Pd electrode, applying a centrifugal force to said Pd electrode, applying suction to said Pd electrode, and applying and removing an adherent tape to said Pd electrode.

15. The method as claimed in claim 9, further comprising heat treating after forming said Pd electrode and before removing the second portion of said Pd electrode.

16. The method as claimed in claim 9, wherein said Pd electrode is a laminated structure including a plurality of layers and a top layer of palladium.

17. The method as claimed in claim 9, further comprising:
forming a barrier metal layer on said Pd electrode, after removing the second portion of said Pd electrode; and
forming an Au-containing pad electrode on said barrier metal layer.

18. The method as claimed in claim 17, further comprising forming an adhesive layer selected from the group consisting of Ti and Cr on said Pd electrode, after removing the second portion of said Pd electrode and before forming said barrier metal layer.

19. The method as claimed in claim 17, further comprising forming an adhesive layer selected from the group consisting of Ti and Cr on said Pd electrode, after forming said barrier metal layer and before forming said pad electrode.

20. The method as claimed in claim 17, wherein said barrier metal layer contains an element selected from the group consisting of Pt, Mo, Ta, and Ni.

* * * * *